United States Patent [19]

Sanjurjo et al.

[11] 4,356,141

[45] Oct. 26, 1982

[54] METHOD OF CASTING SILICON INTO THIN SHEETS

[75] Inventors: Angel Sanjurjo, San Jose; David J. Rowcliffe, Los Altos, both of Calif.; Robert W. Bartlett, Tucson, Ariz.

[73] Assignee: SRI International, Menlo Park, Calif.

[21] Appl. No.: 240,918

[22] Filed: Mar. 5, 1981

[51] Int. Cl.$^3$ ............................................. C04B 35/60
[52] U.S. Cl. ................................................... 264/332
[58] Field of Search ............................... 264/298, 332

[56] References Cited

U.S. PATENT DOCUMENTS 4,256,681  3/1981  Lindmayer ........................ 264/332

OTHER PUBLICATIONS

Kapur et al., Production of Silicon for Solar Cells by the Sodium Reduction of Silicon Tetrafluoride Gas, in Extended Abstracts, vol. 79-1, Abstract No. 60, The Electrochemical Society, May 1979.

*Primary Examiner*—James H. Derrington
*Attorney, Agent, or Firm*—Urban H. Faubion; Donovan J. De Witt

[57] ABSTRACT

Silicon (Si) is cast into thin shapes within a flat-bottomed graphite crucible by providing a melt of molten Si along with a relatively small amount of a molten salt, preferably NaF. The Si in the resulting melt forms a spherical pool which sinks into and is wetted by the molten salt. Under these conditions the Si will not react with any graphite to form SiC. The melt in the crucible is pressed to the desired thinness with a graphite tool at which point the tool is held until the mass in the crucible has been cooled to temperatures below the Si melting point, at which point the Si shape can be removed.

4 Claims, No Drawings

METHOD OF CASTING SILICON INTO THIN SHEETS

PRIOR ART

Kapur, Nanis and Sanjurjo, "Production of Silicon for Solar Cells by the Sodium Reduction of Silicon Tetrafluoride Gas", Extended Abstracts, The Electrochemical Society, Vol. 79-1, Spring Meeting, Boston, Massachusetts, May 6-11, 1979.

THE INVENTION

This invention relates to the production of thin silicon shapes of a sheet-like character. The process of the present invention is one wherein, as the first step, Si is melted in a graphite crucible along with one or more salts of the type melting below Si (1410° C.). The preferred salt for this purpose is sodium fluoride either as employed alone or along with another salt such as sodium silicate. Other salts such as those of Group IA or Group IIA metals in the form of silicates, oxifluosilicates, and halides can also be used. At temperatures above 1410° C. the liquid Si takes the form of a spherical pool which sinks into the molten salt. The latter wets the Si but does not wet the graphite, thus preventing the Si from forming SiC at the graphite walls. As the second step in the process the molten Si sphere, under pressure, is flattened against the bottom of the crucible to a sheet-like shape having a uniform thickness of from about 0.5 to 2.0 mm. A graphite weight such as a piston can be employed as the flattening tool with which to squeeze most of the liquid salt out of the crucible while simultaneously flattening the Si sphere to form a thin, flat shape. While still under the pressure of the piston this Si shape is allowed to solidify by bringing the temperature of the melt below 1410° C. Once the Si has solidified it can be removed from the crucible while the salt is still liquid. The system is then ready for the reloading and remelting of the Si-salt mixture, an operation which can be continuously repeated, if desired.

The proportion of Si to salt can vary over a relatively wide range, thus, good results have been obtained with the following systems:

Si 1 g+1 g (NaF-Na$_2$SiO$_3$(9:1))

Si 1 g+0.2 g (NaF-CaF$_2$(1:1))

Si 1.5 g+0.5 g NaF.

A typical pressure applied to the molten Si to form it into a thin sheet is 0.1 Kg/cm$^{-2}$. This pressure need only be great enough to overcome the natural tendency of the liquid Si mass attributable to its high surface tension, to assume a ball-like shape.

The following example is illustrative of the present invention:

EXAMPLE

One gram of semiconductor grade silicon powder with particle size ranging from 0.1 mm to 1 cm was mixed with an equal amount of a 9 to 1 mixture of NaF and Na$_2$SiO$_3$ powders of reagent grade purity. The Si-salt mixture was loaded in a flat-bottom graphite crucible with an interior height of 1.5 mm and an interior diameter of 2.5 cm. The loaded crucible was installed on an Al$_2$O$_3$ pedestal in turn placed inside a water cooled quartz chamber and kept under an Ar atmosphere. A circular graphite lid having a diameter of about 2.75 cm and a weight of 2.50 g was then placed on top of the Si-salt mixture to act as a piston. The temperature was raised by induction heating of the graphite crucible and top piston. The temperature was monitored by optical pyrometry. The rate of heating was about 100° C. per minute. At 1000° C. the salts melted and wetted the Si grains. At 1412° C., as the Si melted the piston dropped until it touched the upper margin of the graphite crucible thus shaping the Si pool into a disk. The system was kept only 3 minutes at 1450° C. and then cooled rapidly with a fast flow of cool Argon gas. After cooling to room temperature the system was opened and the graphite piston was easily removed by hand. The Si disk was strongly adhered to the bottom of the crucible. After 30 minutes in a 1 N HF aqueous solution the Si disk was easily removed from the graphite crucible. It had a thickness of 1.5 mm.

What is claimed is:

1. The method of casting silicon into thin, flat shapes which comprises melting silicon in a graphite crucible along with one or more salts of the type having a melting point below that of silicon thereby forming a melt wherein the liquid Si takes the form of a spherical pool which sinks into the molten salt, pressing downwardly against the upper surface of the melt using a graphite tool thereby squeezing liquid salt out of the crucible while simultaneously flattening the Si pool to distribute the same into a thin flat shape, cooling the resulting liquid system to a temperature below 1410° C. to solidify the silicon component thereof and removing the resulting thin, flat silicon shape.

2. The method of claim 1 wherein the salt employed is NaF.

3. The method of claim 1 wherein the salt is a mixture of NaF and Na$_2$SiO$_3$.

4. The method of claim 1 wherein the salt is mixture of NaF and CaF$_2$.

* * * * *